United States Patent

Bosselmann et al.

[11] Patent Number: 5,811,964
[45] Date of Patent: Sep. 22, 1998

[54] METHOD AND DEVICE FOR MEASURING AN ELECTRICAL ALTERNATING QUANITY WITH TEMPERATURE COMPENSATION

[75] Inventors: Thomas Bosselmann; Peter Menke, both of Erlangen; Joachim Niewisch, Nürnberg, all of Germany

[73] Assignee: Siemens Aktiengelsellschaft, Germany

[21] Appl. No.: 624,419

[22] PCT Filed: Sep. 22, 1994

[86] PCT No.: PCT/DE94/01104

§ 371 Date: Apr. 1, 1996

§ 102(e) Date: Apr. 1, 1996

[87] PCT Pub. No.: WO95/10046

PCT Pub. Date: Apr. 13, 1995

[30] Foreign Application Priority Data

| Oct. 1, 1993 | [DE] | Germany | 43 33 467.9 |
| Jul. 7, 1994 | [DE] | Germany | 44 23 980.7 |
| Jul. 22, 1994 | [DE] | Germany | 44 26 137.3 |

[51] Int. Cl.$^6$ .......................... G01R 33/032; G01R 15/24
[52] U.S. Cl. .......................... 324/96; 324/117 R
[58] Field of Search ............. 324/96, 105, 117 R, 324/127, 244.1, 752

[56] References Cited

U.S. PATENT DOCUMENTS

| 4,564,754 | 1/1986 | Sato et al. | 324/96 |
| 4,581,579 | 4/1986 | Nagatsuma et al. | 324/96 |
| 4,755,665 | 7/1988 | Ulmer et al. | 324/96 |
| 4,973,899 | 11/1990 | Jones et al. | 324/96 |
| 5,416,860 | 5/1995 | Lee et al. | 324/96 |
| 5,656,934 | 8/1997 | Bosselmann | 324/117 R |

FOREIGN PATENT DOCUMENTS

| 0 088 419 | 9/1983 | European Pat. Off. |
| 0 108 671 | 5/1984 | European Pat. Off. |
| 0 557 090 | 8/1993 | European Pat. Off. |
| 0 586 266 | 3/1994 | European Pat. Off. |
| 34 04 608 | 6/1987 | Germany. |
| 91/01501 | 2/1991 | WIPO. |

OTHER PUBLICATIONS

Ulmer, Jr., High Accuracy Faraday Rotation Measurements, Proc. Conf. Opt. Fiber Sensor, 1988, pp. 288–291, (month unavailable).

*Primary Examiner*—Ernest F. Karlsen
*Attorney, Agent, or Firm*—Kenyon & Kenyon

[57] ABSTRACT

A polarized measuring light is provided to a sensing means under the influence of an alternating electrical quantity, the polarization of the measuring light changing as a function of the alternating electrical quantity. After passing through the sensing means, the measuring light is split into two differently polarized partial light signals, which are then converted into electrical intensity signals S1 and S2. An intensity-normalized signal $P=(S1-S2)/(S1+S2)$ is then formed. A temperature-compensated measured signal can then be derived from the alternating signal component PAC and the direct signal component PDC of the intensity-normalized signal according to the equation $S=(a*PAC+b*1)/(c*PDC+d*1)$. The temperature sensitivity can thus be reduced by a factor of ten.

24 Claims, 6 Drawing Sheets

000
METHOD AND DEVICE FOR MEASURING AN ELECTRICAL ALTERNATING QUANITY WITH TEMPERATURE COMPENSATION

This application is a 371 of PCT/DE94/01104 filed Sep. 22, 1994.

FIELD OF THE INVENTION

The present invention relates to a method and a device for measuring an electrical alternating quantity. In this case, an electrical alternating quantity is understood to include an electrical alternating current, an electrical alternating voltage or an electrical alternating field.

BACKGROUND INFORMATION

Optical measuring methods and measuring devices are used for measuring electrical quantities such as current, voltage or field are known, in which the change in polarization of polarized measuring light as a function of the electrical quantity is evaluated. The magneto-optical Faraday effect is used for measuring an electrical current, and the electro-optical Pockels effect for measuring electrical voltages and fields.

The Faraday effect is understood to be the rotation of the plane of polarization of linearly polarized light as a function of a magnetic field. The angle of rotation is, in this case, proportional to the path integral over the magnetic field along the path traced by the light with the Verdet constant as a constant of proportionality. The Verdet constant depends on the material in which the light travels and on the wavelength of the light. For measuring an electrical current in a current conductor, using the Faraday effect, a Faraday element, which consists of an optically transparent material and generally of glass, is arranged in the vicinity of the current conductor. Linearly polarized light is sent through the Faraday element. The magnetic field generated by the electrical current effects a rotation of the plane of polarization of the light in the Faraday element through an angle of rotation which can be evaluated by an evaluation unit as a measure of the intensity of the magnetic field and, thus, of the intensity of the electrical current. In general, the Faraday element surrounds the current conductor, so that the polarized light circulates around the current conductor in a quasi-closed path. In this case, the amount of the angle of rotation of the polarization is, to a good approximation, directly proportional to the amplitude of the measured current.

In one embodiment of an optical measuring device for measuring an electrical current, disclosed in WO 91/01501, the Faraday element is designed as a part of an optical monomode fiber, which surrounds the current conductor in the form of a measuring winding. The polarized measuring light, therefore, circulates around the current conductor N times in one pass, if N is the number of turns of the measuring winding. In the so-called transmission type, the measuring light passes through the measuring winding only once. In the reflection type, on the other hand, the other end of the fiber is silvered, so that the measuring light, after a first pass, passes through the measuring winding a second time in the reverse direction. Because of the non-reciprocity of the Faraday effect, the angle of rotation in the reflection type is, therefore, twice as large in the same measuring winding as in the transmission type.

The reference EP-B-0 088 419 discloses an optical measuring device for measuring a current, in which the Faraday element is designed as a solid glass ring around the current conductor. Light from a light source is linearly polarized with a polarizer and is then coupled into the Faraday element. The linearly polarized light passes through the Faraday element once and is then split, using a Wollaston prism as a polarizing beam-splitter, into two linearly polarized partial light signals A and B having planes of polarization directed perpendicularly to each other. Each of these two light signals A and B is transmitted via an associated optical transmission fiber to an associated light detector and converted into a corresponding electrical signal PA and PB. An intensity-normalized measured signal $$M=(PA-PB)/(PA+PB)$$

is formed from these two signals PA and PB in a computing unit. This measured signal M is independent of intensity fluctuations of the light source or attenuations in the optical feed lines.

By the electro-optical Pockels effect is understood the change in polarization of polarized measuring light in a material exhibiting the Pockels effect as a result of a linear birefringence induced in the material, which is essentially linearly dependent, via the electro-optical coefficient, on an electrical field penetrating the material. For measuring an electrical field, a Pockels element made of a material showing the Pockels effect is arranged in the electrical field. For measuring an electrical voltage, the voltage to be measured is applied to two electrodes coupled to the Pockels element and the corresponding electrical field present is measured. Polarized measuring light is transmitted through the Pockels element, and the change in polarization of the polarized measuring light as a function of the voltage to be measured or of the field to be measured is evaluated with the aid of a polarization analyzer.

The German Patent No. C-34 04 608 discloses an embodiment of such a measuring device for measuring the electrical field intensity. A sensor device arranged in the electrical field to be measured is optically connected to a light source via a first waveguide and to a measuring device via two further waveguides. The sensor device consists of an optical series circuit of a first lens, a polarizer, a quarter-wave plate ($\lambda/4$-plate), a Pockels element, a polarizing beam-splitter as an analyzer and, two further lenses assigned to the analyzer. The light from the light source is fed via the first waveguide and the first lens to the polarizer and linearly polarized by the polarizer. The linearly polarized light thereupon experiences in the $\lambda/4$-plate a phase shift of $\pi/2$ in one component and is thereby circularly polarized. This circularly polarized light is coupled into the Pockels element and, in general, elliptically polarized by the electrical field. This elliptically polarized light is split in the analyzer into two linearly polarized partial light beams A and B having planes of polarization directed generally perpendicularly to each other. Each of these two partial light signals A and B is coupled into one of the two further waveguides via one of the two further lenses, transmitted to an associated photoelectric converter in the measuring device and converted there, in each case, into an electrical signal PA and PB. From the two electrical signals PA and PB, an intensity-normalized measured signal M=(PA−PB)/(PA+PB) is subsequently derived by a computer of the measuring device. This intensity-normalized measured signal M is proportional to the degree of modulation as a measure of the electrical field intensity and largely independent of intensity losses in the transmission paths or intensity fluctuations of the light source. The degree of modulation is, in this case, defined as the ratio of signal output value to quiescent output value of the Pockels element. A crystal of $Bi_4Ge_3O_{12}$ or of $Bi_4Si_3O_{12}$ having a eulytine structure, which shows no optical activity (intrinsic circular birefringence) and exhibits only a relatively weak temperature sensitivity, is used as the Pockels element.

Disturbing influences caused by additional linear birefringence in the optical materials of the sensor element and the optical transmission paths constitute a problem in all optical measuring methods and measuring devices in which the change in polarization of polarized measuring light in a sensor element which is under the influence of the measured quantity is used as the measuring effect. Such additional linear birefringence can be caused by mechanical stresses, which can result, for example, from bending or vibrations, or from temperature changes. This linear birefringence effected by disturbances leads to an undesired change in the working point and in the measuring sensitivity.

Various temperature compensation methods are already known for compensating for temperature influences.

In the article Proc. Conf. Opt. Fiber Sensors OFS 1988, New Orleans, pages 288 to 291, and the associated U.S. Pat. No. 4,755,665, a temperature compensation method is proposed for a magneto-optical measuring device for measuring alternating currents. In this method, the electrical signals PA and PB obtained in a manner analogous to the previously described measuring device disclosed in EP-B-0 088 419 are respectively decomposed in the reference a filter into their direct current components PA(DC) and PB(DC) and their alternating current components PA(AC) and PE(AC). From the alternating current component PA(AC) and PB(AC) and the direct current component PA(DC) and PB(DC), for each signal PA and PB, to compensate also for different intensity fluctuations in the two transmission paths for the light signals A and B, the quotient QA=PA(AC)/PA(DC) and QB=PB(AC)/PB(DC) is formed from its alternating current component PA(AC) and PB(AC) and its direct current component PA(DC) and PB(DC). From each of these two quotients QA and QB, a time-average value MW(QA) and MW(QB) is formed, and from these two average values MW(QA) and MW(QB), a quotient Q=MW(QA)/MW(QB) is finally formed. Within the framework of an iteration method, a correction factor K for the quotient Q determined is obtained by means of comparison with calibrated values stored in a value table (look-up table). The value Q*K corrected by this correction factor K is used as a temperature-compensated measured value for an electrical alternating current to be measured. With this method, the temperature sensitivity can be reduced to approximately 1/50.

The reference EP-A-0 557 090 discloses a further temperature compensation method for an optical measuring device for measuring magnetic alternating fields, which uses the Faraday effect and is, therefore, suitable also for measuring electrical alternating currents. In this known method, the linearly polarized measuring light, after passing through the Faraday element, is split in an analyzer into two differently linearly polarized partial light signals A and B and, for normalizing the intensity for each of the two associated electrical signals PA and PB separately, the quotient QA=PA(AC)/PA(DC) and QB=PB(AC)/PB(DC) is formed from its associated alternating current component PA(AC) and PB(AC) and its associated direct current component PA(DC) and PB(DC). From the two quotients QA and QB, a measured signal $M=1/((\alpha/QA)-(\beta/QB))$ is now formed in a computing unit, with the real constants $\alpha$ and $\beta$, which fulfil the relationship $\alpha+\beta=1$. This measured signal M is described as substantially independent of changes in the Verdet constant and in the circular birefringence in the Faraday element caused by temperature changes. Nothing is stated about compensation of the temperature-induced linear birefringence.

The reference EP-A-0 486 226 discloses an embodiment of an optical measuring device for measuring an electrical alternating voltage with temperature compensation. An optical series circuit consisting of a polarizer, a $\lambda/4$-plate, a Pockels element and a polarized beam-splitter as an analyzer is connected optically between a light source and an evaluation unit. The sequence of $\lambda/4$-plate and Pockels element in the optical series circuit can certainly also be reversed. The measuring light from the light source is linearly polarized in the polarizer and, after passing through the Pockels element, is split in the analyzer into two partial light signals A and B having different planes of polarization. Each of these partial light signals A and B is converted into a corresponding electrical intensity signal PA and PB. Thereupon, for normalizing the intensity for each of these two electrical intensity signals PA and PB, the quotient QA=PA(AC)/PA(DC) and QB=PB(AC)/PB(DC) is formed from its associated alternating signal component PA(AC) and PB(AC) and its associated direct signal component PA(DC) and PB(DC). From the two intensity-normalized quotients QA and QB, a measured signal $M=1/((\alpha/QA)-(\beta/QB))$ is now formed in a computing unit, with the real constants $\alpha$ and $\beta$. By matching these constants $\alpha$ and $\beta$, the measured signal M is largely independent of linear birefringence in the $\lambda/4$-plate caused by temperature changes.

The compensation of intensity fluctuations by separating the two signals PA and PB into their direct and alternating components according to the described known methods for temperature compensation has the disadvantage of a limited frequency bandwidth of the electrical alternating quantity to be measured. To ensure that no information is lost about the alternating quantity, specifically in the filtering of the two signals PA and PB, the separation frequency between direct and alternating components must lie below the fundamental frequency of the alternating variable, which is normally 50 Hz and, in the U.S., 60 Hz. As an example, intensity fluctuations caused by vibrations can, however, definitely lie in a frequency range approaching these frequencies and can, thus, not be eliminated with the known methods. Moreover, if alternating signals with even smaller frequencies than 50 Hz are to be measured, the disturbing vibration influences become even larger with decreasing frequency. This can also cause problems when offset transients, i.e., signals with AC and DC components, are to be measured.

SUMMARY OF THE INVENTION

An object of the present invention is to provide a method and a device for measuring an electrical alternating quantity, in which influences on the measured signal of temperature changes and of intensity fluctuations are largely compensated.

This object is achieved, according to the present invention, by means of the following method. Polarized measuring light is coupled into an optical sensor element which is under the influence of the electrical alternating quantity. Upon passing through the sensor element, the polarization of the measuring light is changed as a function of the electrical alternating quantity. After passing through the sensor element, the measuring light is split into two linearly polarized partial light signals having different planes of polarization. Subsequently, these two partial light signals are, in each case, converted into corresponding electrical intensity signals. From these two intensity signals, an intensity-normalized signal P is formed, which corresponds to the quotient of the difference and the sum of the two intensity signals and is largely free from intensity fluctuations of the light source or in the transmission paths. This intensity-normalized signal P is now decomposed into an alternating signal component PAC and a direct signal component PDC. Since all intensity fluctuations are already essentially compensated by forming the intensity-normalized signal P, the separation frequency between the alternating signal component PAC and the direct signal component PDC can also be chosen to be very small. The bandwidth of the frequency of the electrical alternating quantity to be measured is, thus, in principle, not limited downwards. From the alternating signal component PAC and the direct signal component PDC of the intensity normalized signal P, a measured signal S is now derived for the electrical alternating quantity which is largely independent of the temperature.

The present invention is based on the recognition of the fact that the alternating signal component PAC contains the information about the electrical alternating quantity, and that the direct signal component PDC, on the other hand, contains information about the temperature.

Advantageous refinements of the measuring method and of the measuring device according to the present invention can be seen in the various preferred embodiments described herein.

In one preferred embodiment, the measured signal S is derived according to the rule $$S=(a*PAC+b*1)/(c*PDC+d*1),$$

a, b, c and d being real coefficients with $a \neq 0$, $c \neq 0$ and $d \neq 0$, and 1 being a unity signal which is equal, in terms of its absolute value, to the intensity-normalized signal P when one of the two electrical intensity signals disappears. By means of this quotient formation of two linear functions of the alternating signal component PAC and of the direct signal component PDC, a measured signal S is obtained in which temperature influences are distinctly reduced in comparison with the intensity-normalized signal P.

In another embodiment, the temperature-compensated measured signal S is derived from the alternating signal component PAC and the direct signal component PDC of the intensity-normalized signal P by means of a pre-established value table (look-up-table) or calibrating function.

BRIEF DESCRIPTION OF THE DRAWINGS

Mutually corresponding parts are provided with the same reference symbols.

FIG. 1 shows one embodiment of the measuring device for measuring an electrical alternating quantity X in a basic construction. A sensor element 3 is provided which changes the polarization of polarized measuring light irradiated into the sensor element 3, under the influence of the electrical alternating quantity X, as a function of the electrical alternating quantity X. The sensor element 3 can be a Faraday element for measuring an electrical alternating current using the magneto-optical Faraday effect, or a Pockels element for measuring an electrical alternating voltage or an electrical alternating field using the electro-optical Pockels effect. Polarized measuring light L is coupled into the sensor element 3. For generating this polarized measuring light L, a light source 4 and associated polarizing means, not shown, or a self-polarizing light source 4, for example a laser diode, and, if necessary, additional polarizing means, not shown, can be provided. The polarized measuring light L passes through the sensor element 3 at least once and, in so doing, experiences a change in its polarization dependent on the electrical alternating quantity X. After passing through the sensor element 3, the measuring light L is fed to an analyzer 7 and decomposed in the analyzer 7 into two linearly polarized partial light signals LS1 and LS2, whose planes of polarization are different from each other. Preferably, the planes of polarization of the two partial light signals LS1 and LS2 are directed perpendicularly to each other (orthogonal decomposition). A polarizing beam splitter, for example a Wollaston prism, or else two polarization filters crossed at a corresponding angle and preferably at 90° and a single beam splitter with a partially reflecting mirror can be provided as the analyzer 7. The sensor element 3 and the analyzer 7 can be connected together optically via a free beam arrangement or via a polarization-maintaining waveguide, preferably a monomode optical fiber such as, for example, a HiBi (high birefringence) fiber or a polarization-neutral LoBi (low birefringence) fiber.

Figure 1:
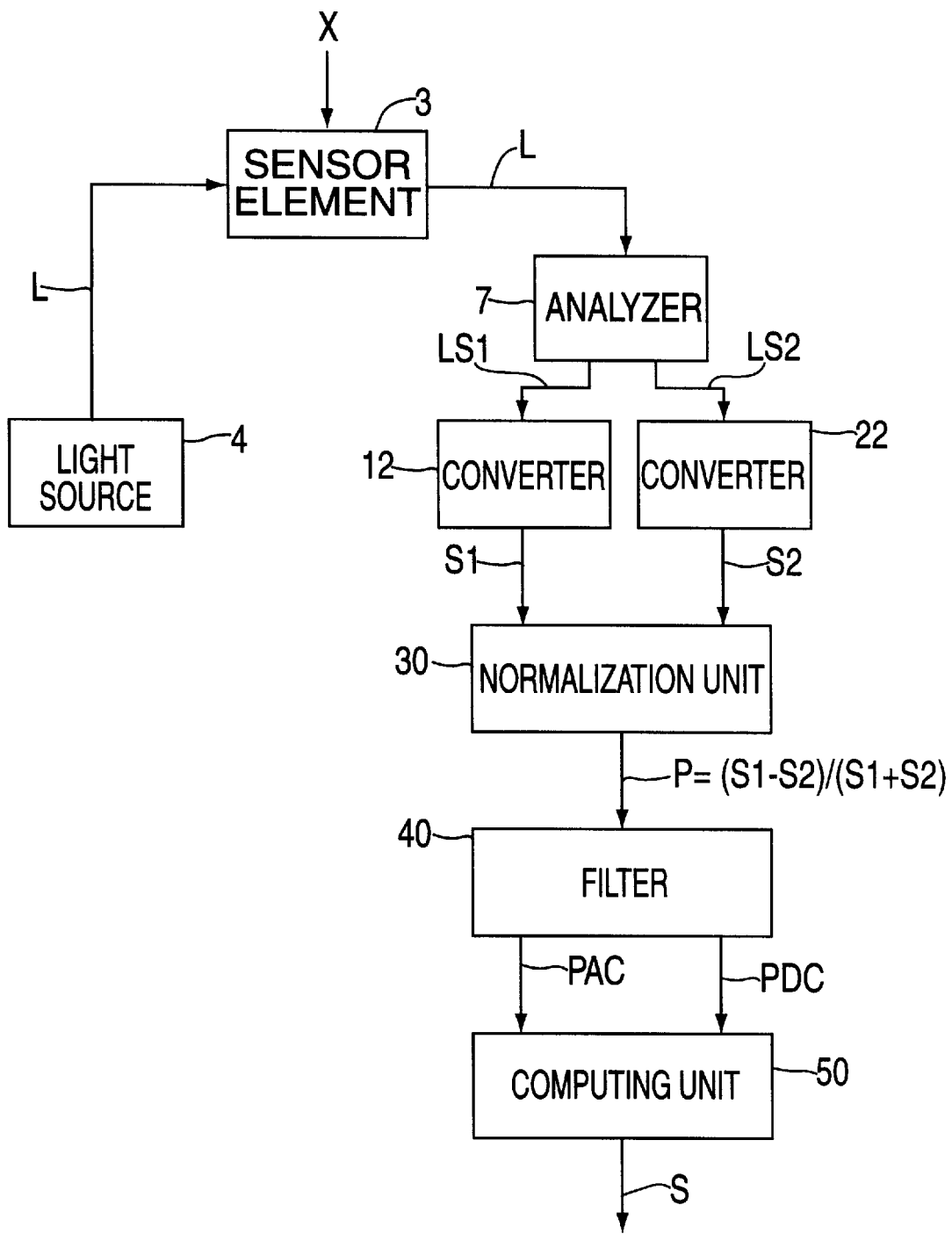
FIG. 1 is a block diagram illustrating a basic construction of an exemplary device for measuring an electrical alternating quantity.

The two partial light signals LS1 and LS2 are then fed in each case to a photoelectric converter 12 or 22. The transmission of the two partial light signals LS1 and LS2 from the analyzer 7 to the respective associated converter 12 and 22 can be carried out via a free beam arrangement or, in each case, via a waveguide. In the converters 12 and 22, the two partial light signals LS1 and LS2 are converted, respectively, into an electrical intensity signal S1 and S2, which is a measure of the intensity of the associated partial light signal LS1 and LS2. These two intensity signals S1 and S2 are fed to inputs of a normalization unit 30. The normalization unit 30 forms, from the two electrical intensity signals S1 and S2, an intensity-normalized signal $$P=(S1-S2)/(S1+S2)$$

which corresponds to the quotient of the difference and the sum of the two intensity signals S1 and S2. This intensity-normalized signal P is essentially independent of intensity fluctuations of the light source 4 or intensity losses in the transmission paths. The intensity-normalized signal P is preferably formed with the aid of analog arithmetic components, but can also be calculated digitally or determined with the aid of a stored value table.

However, changes in the temperature cause a problem because of temperature-induced linear birefringence in the optical materials of the optical measuring device, especially of the sensor element 3 and, associated therewith, the offset of the working point and change in the measuring sensitivity of the measuring device. These temperature-induced measuring errors are now largely compensated by means of a temperature compensation method described as follows, with the aid of a filter 40 and a computing unit 50.

The intensity-normalized signal P present at an output of the normalization unit 30 is fed, for this purpose, to an input of the filter 40. The filter 40 decomposes the intensity-normalized signal P into its alternating signal component PAC and its direct signal component PDC, which are present, respectively, on an output of the filter 40. This alternating signal component PAC and this direct signal component PDC are now fed respectively to one input of the computing unit 50. The computing unit 50 forms a measured signal S from the alternating signal component PAC and the direct signal component PDC according to the rule $$S=(a*PAC+b*1)/(c*PDC+d*1) \quad (1),$$

a, b, c and d being real coefficients with $a \neq 0$, $c \neq 0$ and $d \neq 0$, and 1 being a unity signal which corresponds to a value $P=\pm 1$. It has been shown that, with this measured signal S, both when measuring an alternating current as the electrical alternating quantity X with the aid of a Faraday element, and also when measuring an alternating field or an alternating voltage as electrical alternating quantity X with the aid of a Pockels element, a largely stable measured signal is obtained for the corresponding electrical alternating quantity X, both with respect to intensity fluctuations of the light source and in the optical transmission paths, and also with respect to its working point and measuring sensitivity in the case of variable temperatures. The coefficients a, b, c and d can be determined experimentally for optimizing the temperature independence of the measured signal S. The arithmetic derivation of the measured signal S according to equation (1) is preferably carried out with the aid of corresponding analog components for the arithmetic operations to be performed. In this embodiment, a temperature compensation is possible in real time. The measured signal S can also, however, be calculated digitally with the aid of a microprocessor or computer or can be determined with the aid of a stored value table. The temperature sensitivity of the measured signal S is distinctly smaller than that of the uncompensated signal P. The measuring error can be reduced by a factor of about 10.

Figure 2:
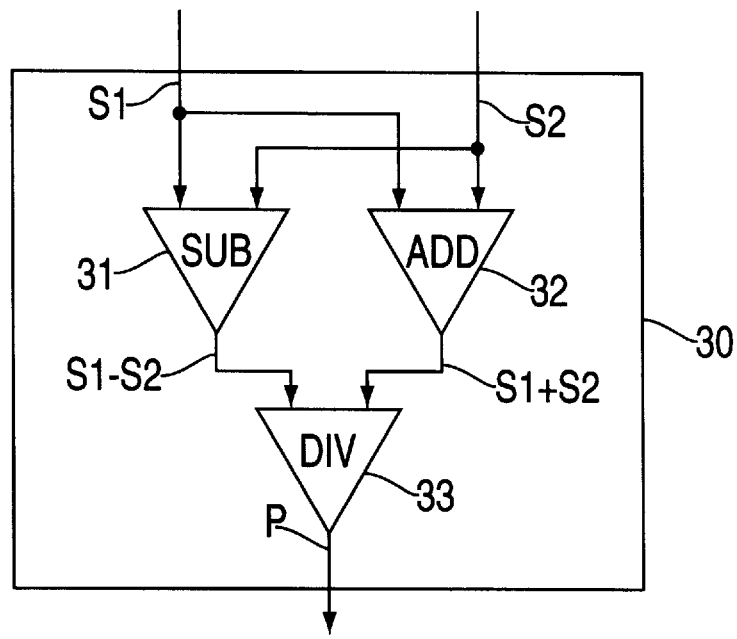
FIG. 2 is a diagram illustrating one embodiment of a normalization unit to be used with an exemplary device for measuring an electrical alternating quantity.

FIG. 2 shows one embodiment of the normalization unit 30. Provision is made of a subtraction unit 31, an adder 32 and a divider 33. The two electrical intensity signals S1 and S2 are applied, in each case, to two inputs of the subtraction unit 31 and of the adder 32. The difference signal S1−S2 present at an output of the subtraction unit 31 and the sum signal S1+S2 present on an output of the adder 32 are fed to two inputs of the divider 33. The intensity-normalized signal P=(S1−S2)/(S1+S2) is then present at an output of the divider 33. This embodiment has the advantage that the intensity normalization can be carried out in real time, if analog components are used.

Figure 3:
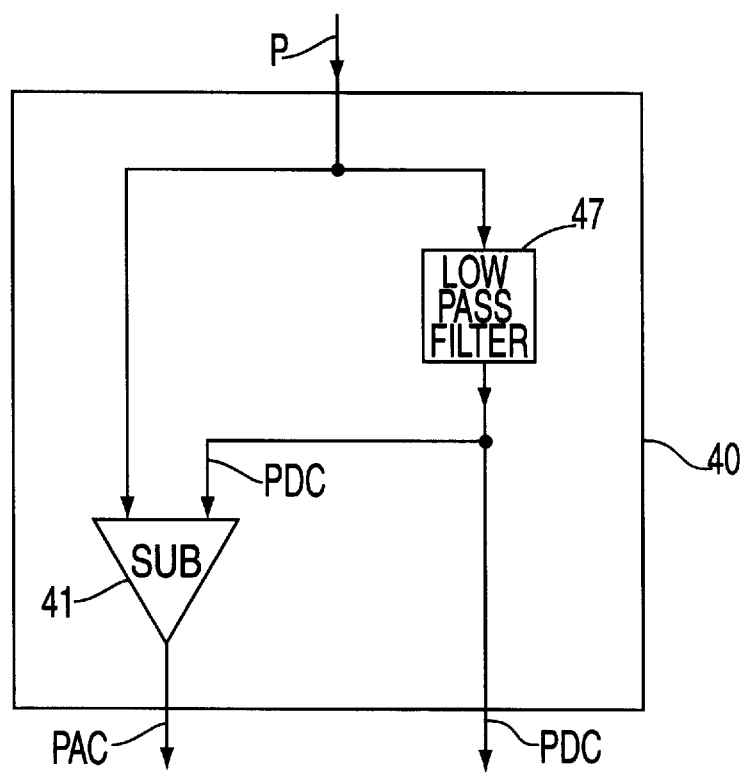
FIG. 3 is a diagram illustrating one embodiment of a filter to be used with an exemplary device for measuring an electrical alternating quantity.

In FIG. 3, one embodiment of the filter 40 for decomposing the intensity-normalized signal P into its alternating signal component PAC and its direct signal component PDC is shown. The filter 40 contains a low-pass filter 47 and a subtraction unit 41. The intensity normalized signal P is applied to an input of the low pass filter 47. The direct signal component PDC of the intensity-normalized signal P, which corresponds to the frequency components of the intensity-normalized signal P which lie below a predetermined separation frequency of the low-pass filter 47, is then present at an output of the low-pass filter 47. This separation frequency of the low-pass filter 47 can also be set low, since intensity fluctuations are already eliminated in the previous intensity normalization in the normalization unit 30 and disturbing higher-frequency intensity fluctuations, for example as a result of vibrations, can thus no longer have a disturbing effect on the alternating signal component PAC. The alternating signal component PAC is now formed simply by subtraction of the direct signal component PDC from the total signal P with the aid of the subtraction unit 41. For this purpose, the intensity-normalized signal P and the direct signal component PDC of the intensity-normalized signal P are applied to two inputs of the subtraction unit 41.

Instead of the embodiment of the filter 40 shown in FIG. 3, a high-pass filter and a low-pass filter can, of course, also be provided for filtering out the alternating signal component PAC and the direct signal component PDC, or a high-pass filter for filtering out the alternating signal component PAC and a subtraction unit for deriving the direct signal component PDC by subtraction of the alternating signal component PAC from the total signal P.

Figure 5:
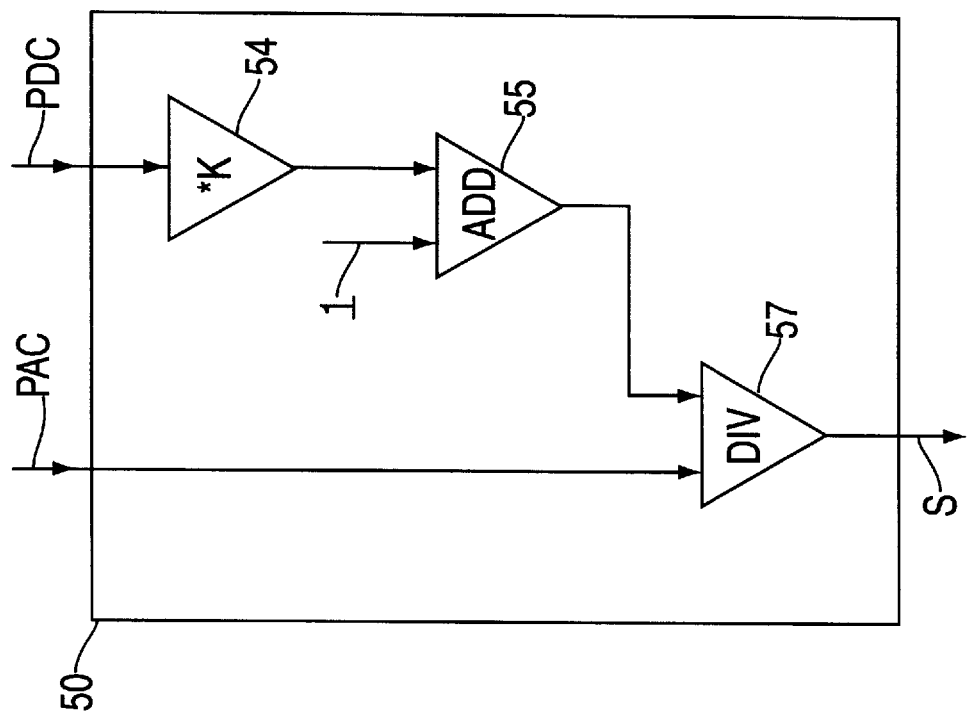
FIG. 5 is a diagram illustrating a second embodiment of a computing unit for temperature compensation to be used with an exemplary device for measuring an electrical alternating quantity.
Figure 4:
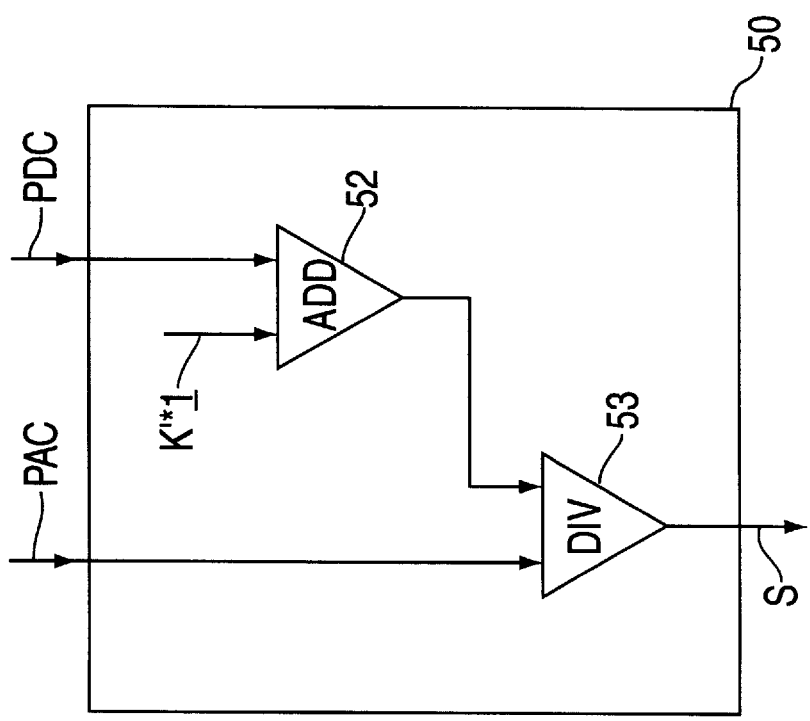
FIG. 4 is a diagram illustrating one embodiment of a computing unit for temperature compensation to be used with an exemplary device for measuring an electrical alternating quantity.

FIGS. 4 and 5 show two particularly simple embodiments of the computing unit 50 and the calculation of the measured signal S carried out in this computing unit 50.

In the embodiment according to FIG. 4, the computing unit 50 contains an adder 52 and a divider 53. The adder 52 forms a sum signal PDC+K'*1 from the direct signal component PDC of the intensity-normalized signal P and a unity signal 1 multiplied by a predetermined real correction factor K'. For this purpose, the direct signal component PDC and the unity signal 1 multiplied by the correction factor K' are fed as input signals to the adder 52. The unity signal 1 corresponds in this case, in terms of its magnitude, to the intensity-normalized signal $P=\pm 1$, which results when exactly one of the two intensity signals S1 or S2 disappears. This is the case, for example, if S2=0 and S1≠0. The sum signal PDC+K'*1 of the direct signal component PDC and the unity signal 1 multiplied by the correction factor K' is, thus, present at the output of the adder 52. The quotient PAC/(PDC+K'*1) is formed from the alternating signal component PAC and the sum signal PDC+K'*1 by the divider 53. For this purpose, the alternating signal component PAC is applied to a first input of the divider 53, and the sum signal PDC+K'*1 from the adder 42 is applied to a second input of the divider 53. The quotient present at the output of the divider 53 is used as the measured signal $$S=PAC/(PDC+K'*1) \quad (2)$$

for the electrical alternating quantity X. By means of a suitable experimentally determinable selection of the correction factor K', the temperature dependence of the measured signal S can be minimized.

In the embodiment of the computing unit 50 shown in FIG. 5, instead of the adder 52, an amplifier 54 and an adder 55 are provided, which, together, form means for generating a sum signal K*PDC+1 from the direct signal component PDC multiplied by a predetermined real correction factor K and the unity signal 1. For this purpose, the direct signal component PDC is fed to the amplifier 54 as an input signal and multiplied in the amplifier 54 by the gain factor of the amplifier 54, set to the correction factor K. The output signal K*PDC of the amplifier 54 is fed to an input of the adder 55 as a first input signal. The unity signal 1 forms a second input signal at a further input of the adder 55. The sum signal K*PDC+1 is consequently present at the output of the adder 55. The alternating signal component PAC is again applied to a first input of the divider 53, as in FIG. 4, while the second input of the divider 53 is now connected to the output of the adder 55. Consequently, the quotient PAC/(K*PDC+1) of the alternating signal component PAC and the sum signal K*PDC+1 is present at the output of the divider 53. This quotient is now used as the measured signal $$S=PAC/(K*PDC+1) \quad (3)$$

for the electrical alternating variable X. This measured signal S is largely stable, just like the measured signal S according to FIG. 4 and equation (2), both with respect to temperature changes and with respect to intensity changes.

The correction factor K is preferably set in such a way that the temperature dependence of the measured signal S is, at least approximately, a minimum.

The calculation of the measured signal S can be carried out in real time in all the embodiments, since the computing unit 50 can be realized with analog components.

Figure 6:
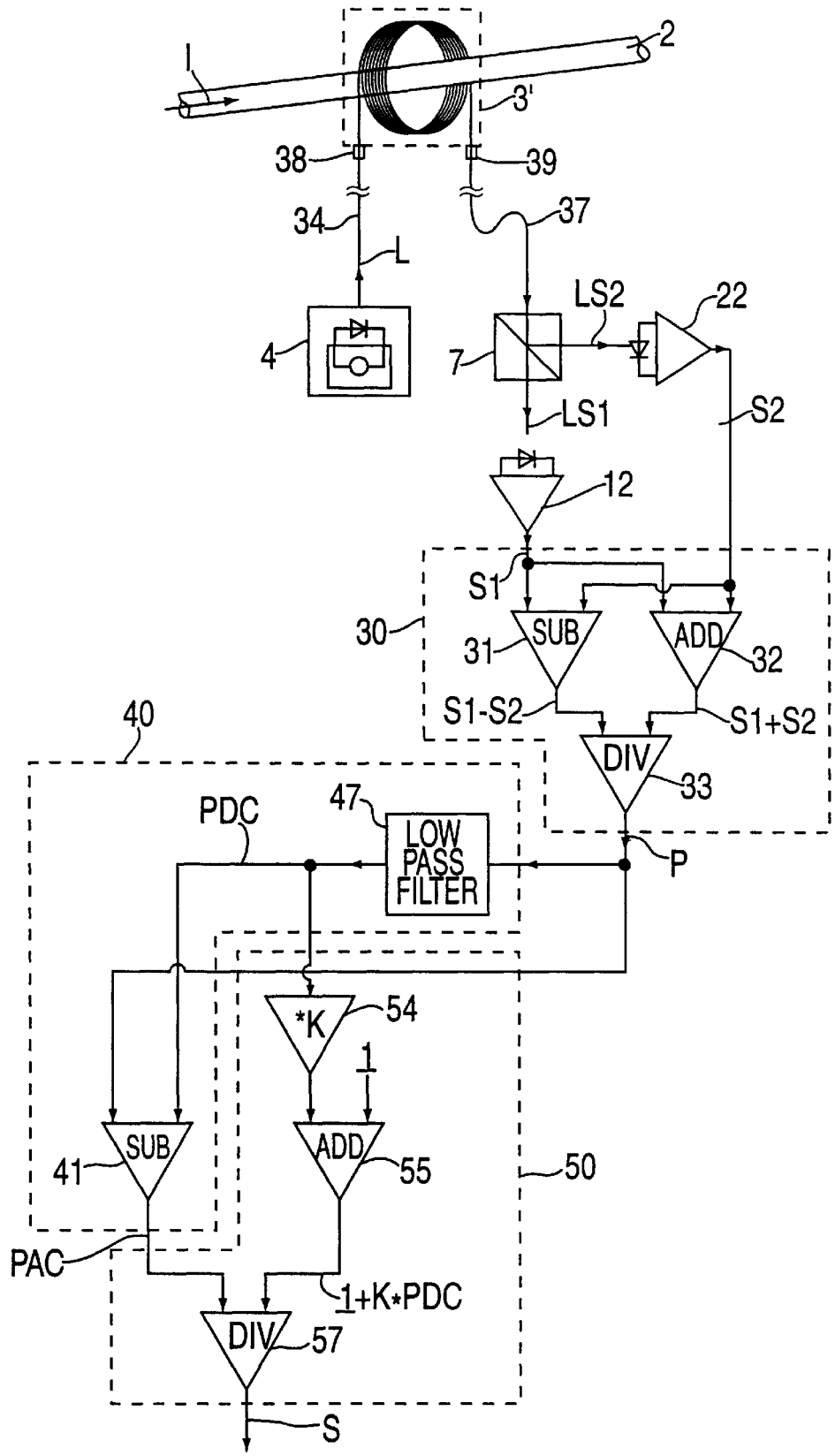
FIG. 6 is a diagram illustrating one embodiment of an exemplary device for measuring an electrical alternating current with a Faraday element.

In FIG. 6, one embodiment of a measuring device for measuring an electrical alternating current I in a current conductor 2 with a Faraday element 3' assigned to the current conductor 2 as a sensor element is shown.

Linearly polarized measuring light L from a linearly polarized light source 4 is coupled into the Faraday element 3' preferably via a polarization-maintaining waveguide 34, is coupled out from the Faraday element 3' after at least one passage through the Faraday element 3', and is fed to the analyzer 7 preferably via a polarization-maintaining waveguide 37. The transmission of the measuring light L coupled out from the Faraday element 3' to the analyzer 7 can also be carried out via a free-beam arrangement. The measuring light L coupled out has a polarization rotated by a measuring angle α, not shown, as a result of the Faraday effect. The measuring angle α is, in this case, a function of an alternating current I in the current conductor 2.

In the embodiment shown according to FIG. 6, the Faraday element 3' is formed with a waveguide, preferably an optical fiber, which surrounds the current conductor 2 in a measuring winding with at least one measuring turn. The waveguide of the Faraday element 3' is connected to the waveguide 34 for feeding the measuring light L and to the waveguide 37 for carrying away the measuring light L, in each case preferably via a splice 35 or 39.

As a Faraday element 3', however, one or several solid bodies made of a Faraday material and forming a light path, preferably a glass ring, can also be provided. The Faraday element 3' does not have to surround the current conductor 2 in a closed light path, but can also be arranged spatially close to the current conductor 2. Furthermore, apart from the embodiment shown of the transmission type, in which the measuring light L passes through the Faraday element 3' only in one direction, an embodiment of the reflection type is also possible, in which the measuring light L, after a first passage, is reflected back into the Faraday element 3' and passes through the Faraday element 3' a second time in the reverse direction.

The light coupled out from the Faraday element 3' is split by the analyzer 7 into two linearly polarized light signals LS1 and LS2 with planes of polarization which are different and preferably directed perpendicularly to each other. For this purpose, a polarizing beam splitter such as, for example, a Wollaston prism is preferably provided as the analyzer 7. Two polarizing filters crossed at a corresponding angle and preferably at 90° and a single beam splitter can, of course, also be provided for this function.

The two light signals LS1 and LS2 are then converted, in associated opto-electrical converters 12 and 22, for which photodiodes preferably connected in amplifier groups are provided, into electrical intensity signals S1 and S2, which are a measure of the light intensities of the respective light signals LS1 and LS2.

The electrical intensity signals S1 and S2 are now fed to the normalization unit 30 which is preferably constructed as shown in FIG. 2. The intensity-normalized signal P=(S1−S2)/(S1+S2) is present at an output of the normalization unit 30. This intensity-normalized signal P is intensity-fluctuation-compensated, that is to say fluctuations in the light intensities, especially as a result of micro-bending losses in the waveguides as a result of vibrations or other mechanical effects and as a result of fluctuations of the intensity of the light source 4, are virtually eliminated.

In order now to undertake temperature compensation, the intensity-normalized signal P is decomposed by the filter 40 into its alternating signal component PAC and its direct signal component PDC. For this purpose, once again as in the embodiment according to FIG. 3, the low-pass filter 47 and the subtraction unit 41 are, of course, provided. Other embodiments of the filter 40 can, of course, also be used.

The alternating signal component PAC and the direct signal component PDC are now fed to the computing unit 50. The computing unit 50 shown corresponds to the advantageous embodiment according to FIG. 5 and equation (3), but is not limited to this embodiment and can, for example, also be designed according to FIG. 4 and equation (2) or for the derivation of a measured signal S according to equation (1). Consequently, in the embodiment shown, the quotient PAC/(K*PDC+1) is used as the measured signal S for the electrical alternating current I.

The dependence of the measured signal S on the temperature can be minimized by suitable selection of the correction factor K. For this purpose, in a particularly advantageous embodiment, the input coupling angle η, not shown, of the plane of polarization of the linearly polarized measuring light L coupled into the Faraday element 3' to an intrinsic axis of the linear birefringence of the Faraday element 3', and the output coupling angle θ, likewise not shown, between this intrinsic axis and an intrinsic axis of the analyzer 7, and the correction factor K are set in such a way that the conditions:

$$\cos(2\cdot\theta+2\cdot\eta)=-2/(3\cdot K) \quad (4a)$$

$$\sin(2\cdot\theta-2\cdot\eta)=1 \quad (4b)$$

are fulfilled, at least approximately.

An intrinsic axis of a birefringent material is defined, in this case, by the state of polarization of linearly polarized light that leaves the material again unchanged. Possible angle values as solutions of said equations (4a) and (4b) are, for example, η=10.45° and θ=55.45° for K=2. Deviations from the angle values satisfying said conditions (4a) and (4b) exactly are possible, especially in the case of large linear and/or circular birefringence in the Faraday element 3', and can amount to approximately 5°.

Calculations yielded the result that, in the case of input coupling angle η and output coupling angle θ selected in this way as a function of the correction factor K, the measured signal S exhibits a particularly simple dependence on the Faraday angle of rotation or measuring angle α. Specifically, the relationship $$S=\sin(2\cdot\alpha) \quad (5)$$

is then valid, to a good approximation.

This measured signal S corresponds to the theoretical measured signal for the measuring angle α without birefringence effects. In consequence, the evaluation procedure is particularly simple. At predetermined input and output coupling angles η and θ, the correction factor K is to be set in such a way that the measured signal S from the measured device corresponds to the measured signal in the absence of birefringence. With this correction factor K, the measuring device is then adjusted to minimum temperature drift.

If, on the other hand, the calculation of the measured signal S is based on the rule S=PAC/(PDC+K'*1) according to equation (2) which can, for example, be carried out with a computing unit 50 according to FIG. 4, the relationships between the correction factor K' and the input coupling angle η and the output coupling angle θ then are as follows:

$$\cos(2\cdot\theta + 2\cdot\eta) = -(2/3)\cdot K' \quad (6a)$$

$$\sin(2\cdot\theta - 2\cdot\eta) = 1 \quad (6b).$$

With angles η and θ set according to these equations (6a) and (6b) as a function of the correction factor K', the measured signal $$S = (1/K')\cdot\sin(2\cdot\alpha) \quad (7)$$

is obtained, which corresponds to the theoretical measured signal sin(2·α) without birefringence except for a scaling by the factor 1/K'.

Possible angle values as solutions of said equations (6a) and (6b) are, for example, η=10.45° and θ=55.45° for K'=1. Deviations from the angle values satisfying the conditions (6a) and (6b) exactly are possible, especially in the case of large linear and/or circular birefringence in the Faraday element 3', and can amount to approximately 5°.

Figure 7:
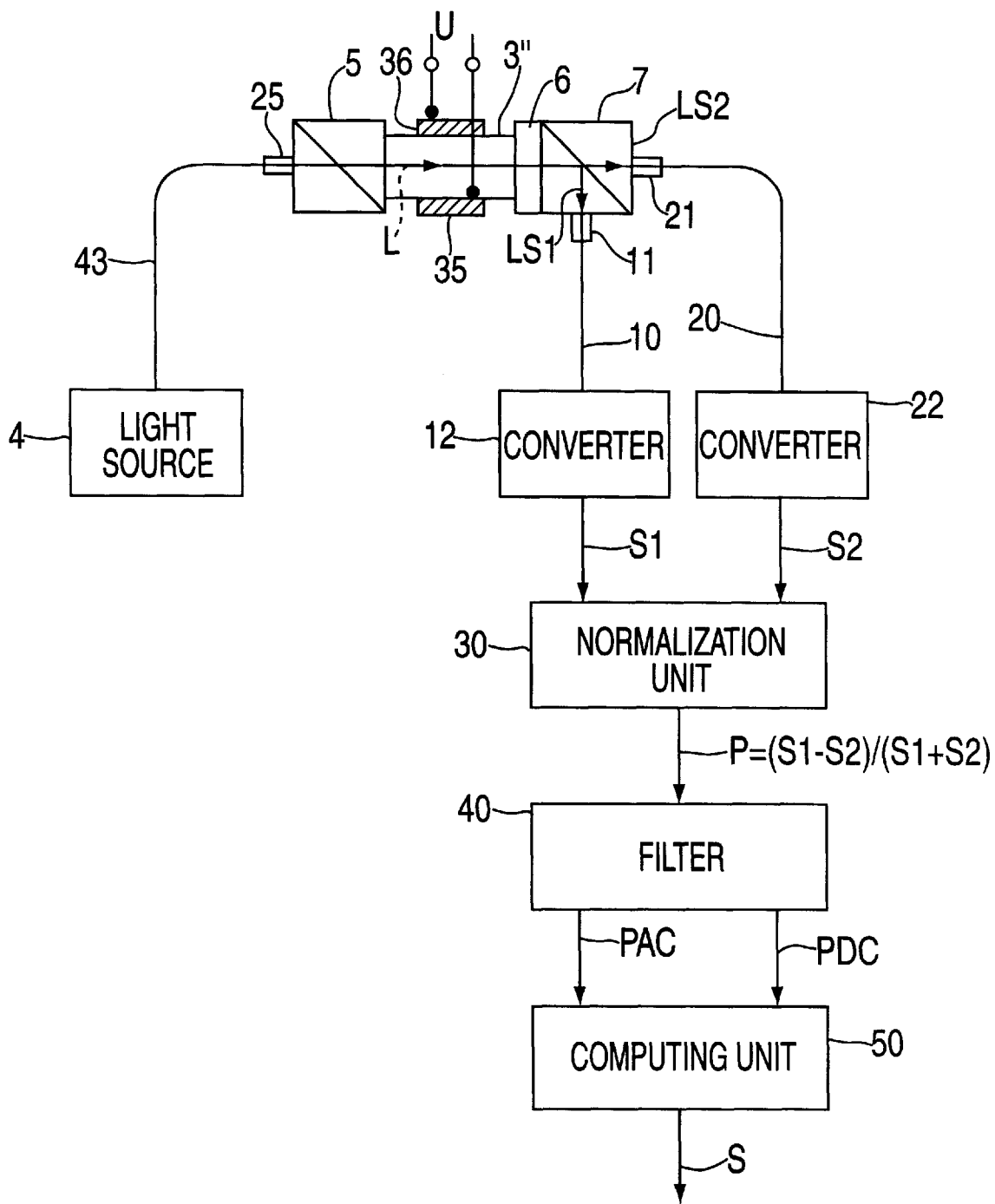
FIG. 7 is a diagram illustrating one embodiment of an exemplary device for measuring an electrical alternating voltage with a Pockels element.

FIG. 7 shows one embodiment of a device for measuring an electrical alternating voltage U as alternating quantity X with a Pockels element 3". The alternating voltage U to be measured can be applied to the Pockels element 3" via two electrodes 35 and 36. Polarized measuring light L is coupled into the Pockels element 3". This measuring light L passes through the Pockels element 3" and, in so doing, experiences a change in its polarization dependent on the applied alternating voltage U. The alternating voltage U is applied, in the embodiment shown, perpendicularly to the direction of light propagation of the measuring light L (transverse embodiment), but can also be applied parallel to the direction of light propagation (longitudinal embodiment). A light source 4, for example a light-emitting diode, and a polarizer 5 for the linear polarization of the light from the light source 4 are provided as means for coupling the measuring light L into the Pockels element 3". The light source 4 and the polarizer 5 are connected to each other optically, preferably via a waveguide 43, for example a multimode optical fiber, but can also be coupled together optically by means of a free-beam coupling. For coupling the light from the waveguide 43 into the polarizer 5, a collimator lens (Grin lens) 25 is preferably provided. The now linearly polarized measuring light L is coupled out of the polarizer 5 into the Pockels element 3". After passing through the Pockels element 3", the measuring light L is fed to the analyzer 7 via a λ/4-plate 6. In the analyzer 7, the measuring light L is decomposed into two linearly polarized partial light signals LS1 and LS2, whose planes of polarization are different from each other. The planes of polarization of the two partial light signals LS1 and LS2 are preferably directed perpendicularly to each other (orthogonal decomposition). A polarizing beam splitter, for example a Wollaston prism, or two polarization filters crossed at a predetermined angle, preferably 90°, and a single beam splitter can be provided as the analyzer 7.

The two partial light signals LS1 and LS2 are coupled in each case into a waveguide 10 or 20, preferably in each case via a collimator lens 11 or 21, and fed in each case to the associated photoelectric converter 12 or 22 via this waveguide 10 or 20. In the converters 12 and 22, the two partial light signals LS1 and LS2 are converted respectively into an electrical intensity signal S1 and S2, which is a measure of the intensity of the associated partial light signal LS1 and LS2. These two intensity signals S1 and S2 are fed to inputs of a normalization unit 30. The normalization unit 30 forms an intensity-normalized signal P=(S1−S2)/(S1+S2) from the two electrical intensity signals S1 and S2, which corresponds to the quotient of the difference and the sum of the two intensity signals S1 and S2. This intensity-normalized signal P is essentially independent of intensity fluctuations of the light source or intensity losses in the transmission paths.

The working point of the measuring device is preferably set in such a way that circularly polarized measuring light is present at the analyzer 7 when no electrical field is present at the Pockels element 3". The two intrinsic axes of the linear birefringence in the Pockels element 3" are, in this case, "uniformly illuminated" by the measuring light L. That means that the components of the measuring light L projected onto the two intrinsic axes have the same intensity respectively. In general, the two partial light signals LS1 and LS2 are then likewise equally strong in their intensity and the intensity-normalized signal P is equal to zero for U=0 V. If an alternating voltage U≠0 V is present on the Pockels element 3", the components of the measuring light L along the electro-optically active intrinsic axes of the linear birefringence of the Pockels element 3" are changed in their intensity as a function of the alternating voltage U.

Such a change in polarization of the measuring light L is, however, also caused by a change in the temperature in the Pockels element 3" or of the λ/4-plate 6 and in a temperature-dependent linear birefringence hence effected. Temperature changes thus lead to an offset of the working point of the measuring device. This temperature-dependent working point drift is now largely compensated by the already described temperature compensation method with the aid of the filter 40 and the computing unit 50.

The intensity-normalized signal P present at an output of the normalization unit 30 is fed, for this purpose, to an input of the filter 40. The filter 40 decomposes the intensity-normalized signal P into its alternating signal component PAC and its direct signal component PDC, which are present respectively at an output of the filter 40. This alternating signal component PAC and this direct signal component PDC are now fed respectively to an input of the computing unit 50. The computing unit 50 forms a measured signal S from the alternating signal component PAC and the direct signal component PDC according to the rule $$S = (a*PAC + b*1)/(c*PDC + d*1),$$

a, b, c and d being real coefficients with a≠0, c≠0 and d≠0, and 1 being the aforementioned unity signal.

By means of the intensity normalization in the normalization unit 30 and the subsequent temperature compensation with the aid of the filter 40 and of the computing unit 50, a measured signal S is consequently obtained for the electrical alternating voltage U, which is largely freed both from intensity fluctuations and from temperature influences.

Instead of the optical series circuit of the polarizer 5, the Pockels element 3", the λ/4-plate 6 and the analyzer 7 shown in FIG. 7, an optical series circuit can be provided consisting of the polarizer 5, the λ/4-plate 6, the Pockels element 3" and the analyzer 7, that is to say the sequence of the λ/4-plate 6 and the Pockels element 3" is just reversed. In this case, the measuring light L is circularly polarized before being coupled into the Pockels element 3".

Furthermore, instead of the light source 4 and the polarizer 5, a light source for transmitting linearly polarized light, such as, for example, a laser diode, can be provided for coupling polarized measuring light L into the Pockels element 3" or the λ/4-plate 6. The waveguide 43 is then preferably a polarization-maintaining waveguide.

The transmission of the partial light signals LS1 and LS2 can, furthermore, also be carried out in a free-beam arrangement. The analyzer 7 can, furthermore, be connected optically to the λ/4-plate 6 or to the Pockels element 3" via a polarization-maintaining waveguide.

Figure 8:
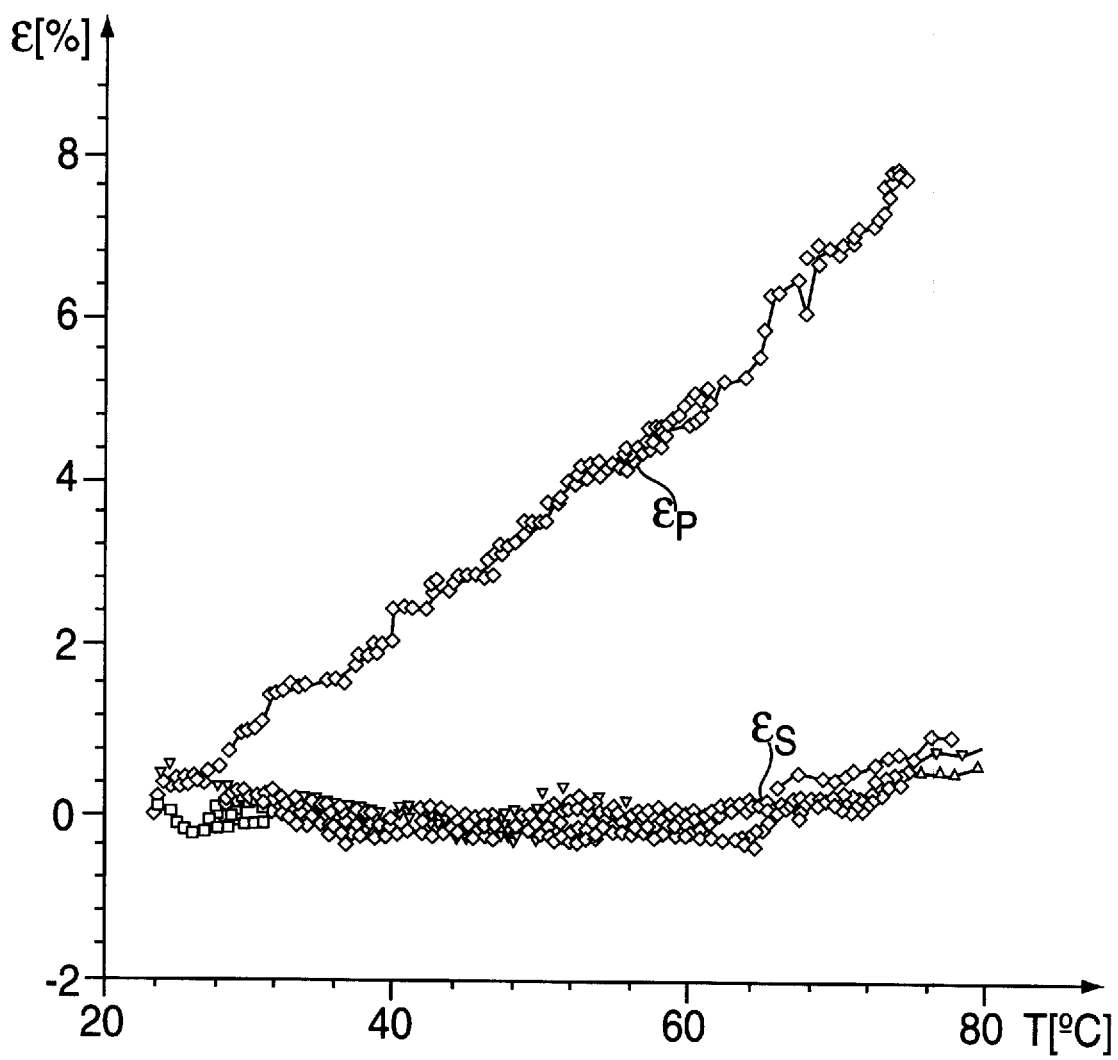
FIG. 8 is a graph illustrating the measuring error with and without temperature compensation, where the measuring error $\epsilon$ is plotted as a function of the temperature.

FIG. 8 shows in a diagram, measured curves of the temperature dependence of the measured signal S and of the uncompensated signal P. The measuring error $\epsilon=\epsilon(T)$ is plotted as a function of the temperature T. The individual points correspond to measured values. The curve designated with $\epsilon_p$ corresponds to the measuring error as a function of the temperature in the case of the not yet temperature-compensated signal P. The approximately linear increase of the measuring error with increasing temperature can be seen. The measuring curve designated with $\epsilon_s$ corresponds to the measuring error as a function of the temperature in the temperature-compensated measured signal S. According to this, the measuring error is essentially constant with temperature. The measured values shown were measured with a device according to FIG. 6 for measuring an electrical alternating current.

In an embodiment not shown, the measured signal S can, besides with the aid of one of the formulas (1), (2) or (3), also be derived by means of a previously determined value table stored in at least one memory or by means of a previously determined, stored calibrating function from the alternating signal component PAC and the direct signal component PDC of the intensity-normalized signal P. By using the value table or the calibrating function, to each pair of values of the alternating signal component PAC and the direct signal component PDC is assigned a measured signal S as a function F(PAC,PDC) of the alternating signal component PAC and of the direct signal component PDC. For values of the active signals PAC and PDC lying between the stored values, an interpolation procedure known as such is used. The corresponding function F(PAC,PDC) can be determined experimentally or by theoretical approximation.

In a special embodiment as a function F(PAC,PDC) for the measured signal S, the product PAC*f(PDC) of the alternating signal component PAC and a function f(PDC) only of the direct signal component PDC is used. The function f(PDC) can be approximated by a linear or quadratic function of the direct signal component PDC as a fit-function with correspondingly chosen coefficients in order to reduce the necessary number of calibrating measurements.

What is claimed is:

1. A method for measuring an alternating electrical quantity, comprising the steps of:
    placing a sensing means under the influence of the alternating electrical quantity;
    providing a polarized measuring light to the sensing means so that the polarization of the polarized measuring light changes as a function of the alternating electrical quantity;
    splitting the polarized measuring light after it passes through the sensing means into two linearly polarized partial light signals having different planes of polarization;
    converting each of the partial light signals into electrical intensity signals S1 and S2, respectively;
    deriving an intensity-normalized signal P in accordance with the equation:

$$P=(S1-S2)/(S1+S2);$$

decomposing the intensity-normalized signal into an alternating signal component and a direct signal component; and
    deriving a temperature-compensated measured signal from the alternating signal component and the direct signal component of the intensity-normalized signal.

2. The method of claim 1, wherein the temperature-compensated measured signal is derived according to the equation $$S=(a*PAC+b*1)/(c*PDC+d*1),$$

where PAC is the alternating signal component of the intensity-normalized signal; PDC is the direct signal component of the intensity-normalized signal; a, c and d are real, non-zero coefficients; b is a real coefficient; and 1 is a unity signal with an absolute value equal to the intensity-normalized signal when one of the two electrical intensity signals disappears.

3. The method of claim 2, wherein the coefficients a, b, c, and d are selected so as to minimize the temperature dependence of the measured signal.

4. The method of claim 2, wherein a=1, b=0, c=K, and d=1, K being a real number correction factor.

5. The method of claim 2, wherein a=1, b=0, c=1, and d=K', K' being a real number correction factor.

6. The method of claim 1, wherein the temperature-compensated measured signal is derived by means of a previously established value table or calibrating function.

7. The method of claim 1, wherein the alternating electrical quantity to be measured is either an alternating electrical voltage or an alternating electrical field and the sensing means is a Pockels element.

8. The method of claim 1, wherein the alternating electrical quantity to be measured is an alternating electrical current in a current conductor and the sensing means is a Faraday element coupled to the current conductor.

9. The method of claim 1, wherein the polarized measuring light is linearly polarized.

10. The method of claim 1, wherein the polarized measuring light is circularly polarized.

11. The method of claim 4, wherein the sensing means is a Faraday element having a linear birefringence and the polarized measuring light is polarized linearly and is provided to the Faraday element in such a way that an input coupling angle η of the plane of polarization of the polarized measuring light to an intrinsic axis of the linear birefringence and an output coupling angle θ between the intrinsic axis of the linear birefringence and an intrinsic axis of an analyzer used for splitting the polarized measuring light substantially satisfy the following conditions:

$$\cos(2\theta+2\eta)=-2/(3K)$$

$$\sin(2\theta-2\eta)=1.$$

12. The method of claim 5, wherein the sensing means is a Faraday element having a linear birefringence and the polarized measuring light is polarized linearly and is provided to the Faraday element in such a way that an input coupling angle η of the plane of polarization of the polarized measuring light to an intrinsic axis of the linear birefringence and an output coupling angle θ between the intrinsic axis of the linear birefringence and an intrinsic axis of an analyzer used for splitting the polarized measuring light substantially satisfy the following conditions:

$$\cos(2\theta+2\eta)=-(2/3)*K'$$

$$\sin(2\theta-2\eta)=1.$$

13. A device for measuring an alternating electrical quantity, comprising:

means for sensing the alternating electrical quantity;

means for providing a polarized measuring light to the sensing means so that the polarization of the polarized measuring light changes as a function of the alternating electrical quantity;

means for splitting the polarized measuring light after it passes through the sensing means into two linearly polarized partial light signals having different planes of polarization;

means for converting each of the partial light signals into electrical intensity signals S1 and S2;

means for deriving an intensity-normalized signal P in accordance with the equation $$P=(S1-S2)/(S1+S2);$$

means for decomposing the intensity-normalized signal into an alternating signal component and a direct signal component; and means for deriving a temperature-compensated measured signal from the alternating signal component and the direct signal component of the intensity-normalized signal.

14. The device of claim 13, wherein the means for deriving the temperature-compensated measured signal comprises a calculation unit which derives the temperature-compensated measured signal according to the equation $$S=(a*PAC+b*1)/(c*PDC+d*1),$$

where PAC is the alternating signal component of the intensity-normalized signal; PDC is the direct signal component of the intensity-normalized signal; a, c and d are real, non-zero coefficients; b is a real coefficient; and 1 is a unity signal with an absolute value equal to the intensity-normalized signal when one of the two electrical intensity signals disappears.

15. The device according to claim 14, wherein the coefficients a, b, c, and d are selected so as to minimize the temperature dependence of the measured signal.

16. The device according to claim 14, wherein a=1, b=0, c=K, and d=1, K being a real number correction factor.

17. The device according to claim 14, wherein a=1, b=0, c=1, and d=K', K' being a real number correction factor.

18. The device according to claim 13, wherein the alternating electrical quantity to be measured is either an alternating electrical voltage or an alternating electrical field and the sensing means is a Pockels element.

19. The device according to claim 13, wherein the alternating electrical quantity to be measured is an alternating electrical current in a current conductor and the sensing means is a Faraday element coupled to the current conductor.

20. The device of claim 13, wherein the polarized measuring light is linearly polarized.

21. The device of claim 13, wherein the polarized measuring light is circularly polarized.

22. The device of claim 16, wherein the sensing means is a Faraday element having a linear birefringence and the polarized measuring light is polarized linearly and is provided to the Faraday element in such a way that an input coupling angle η of the plane of polarization of the polarized measuring light to an intrinsic axis of the linear birefringence and an output coupling angle θ between the intrinsic axis of the linear birefringence and an intrinsic axis of an analyzer used for splitting the polarized measuring light substantially satisfy the following conditions:

$$\cos(2\theta+2\eta)=-2/(3K)$$

$$\sin(2\theta-2\eta)=1.$$

23. The device of claim 16, wherein the sensing means is a Faraday element having a linear birefringence and the polarized measuring light is polarized linearly and is provided to the Faraday element in such a way that an input coupling angle η of the plane of polarization of the polarized measuring light to an intrinsic axis of the linear birefringence and an output coupling angle θ between the intrinsic axis of the linear birefringence and an intrinsic axis of an analyzer used for splitting the polarized measuring light substantially satisfy the following conditions:

$$\cos(2\theta+2\eta)=-(2/3)*K'$$

$$\sin(2\theta-2\eta)=1.$$

24. The device according to claim 13, wherein the means for deriving the temperature-compensated measuring signal comprises at least one means for storing a previously established value table or calibrating function.

* * * * *